United States Patent
Harasaki

(10) Patent No.: US 9,285,806 B2
(45) Date of Patent: Mar. 15, 2016

(54) TRAVELING VEHICLE SYSTEM

(71) Applicant: MURATA MACHINERY, LTD., Kyoto-shi, Kyoto (JP)

(72) Inventor: Kazumi Harasaki, Inuyama (JP)

(73) Assignee: MURATA MACHINERY, Ltd., Kyoto (JP)

( * ) Notice: Subject to any disclaimer, the term of this patent is extended or adjusted under 35 U.S.C. 154(b) by 95 days.

(21) Appl. No.: 14/372,522

(22) PCT Filed: Dec. 5, 2012

(86) PCT No.: PCT/JP2012/081524
§ 371 (c)(1),
(2) Date: Jul. 16, 2014

(87) PCT Pub. No.: WO2013/108501
PCT Pub. Date: Jul. 25, 2013

(65) Prior Publication Data
US 2014/0358338 A1 Dec. 4, 2014

(30) Foreign Application Priority Data
Jan. 17, 2012 (JP) ................................. 2012-006876

(51) Int. Cl.
| B61L 23/04 | (2006.01) |
| G05D 1/02 | (2006.01) |
| H01L 21/677 | (2006.01) |
| H01L 21/67 | (2006.01) |

(52) U.S. Cl.
CPC ............ *G05D 1/0289* (2013.01); *B61L 23/042* (2013.01); *G05D 1/0297* (2013.01); *H01L 21/67715* (2013.01); *H01L 21/67724* (2013.01); *H01L 21/67727* (2013.01); *G05D 2201/0216* (2013.01); *H01L 21/67288* (2013.01)

(58) Field of Classification Search
CPC .............. G05D 1/0289; G05D 1/0297; G05D 2201/0216; G08G 1/164; G08G 1/166; G08G 1/01; G08G 1/0104; G08G 1/0125; G08G 1/0137; G08G 1/0145; B61L 23/14; B61L 23/30; B61L 23/32; B61L 23/04–23/048; B61L 27/0011; B61L 27/0027; B61L 27/04; B61L 2210/02
See application file for complete search history.

(56) References Cited

U.S. PATENT DOCUMENTS

2011/0178657 A1 7/2011 Harasaki

FOREIGN PATENT DOCUMENTS

| JP | 2005-284779 A | 10/2005 |
| JP | 2006-313461 A | 11/2006 |
| JP | 2010-15231 A | 1/2010 |
| WO | 2010/035411 A1 | 4/2010 |

*Primary Examiner* — Spencer Patton
(74) *Attorney, Agent, or Firm* — Keating & Bennett, LLP

(57) ABSTRACT

A traveling vehicle system includes a track network including tracks, a plurality of traveling vehicles, and a traveling vehicle controller. The controller is programmed and configured to include an abnormality detecting unit configured to detect an abnormality in a track on the downstream side of a diverging section including at least the track; and an entry determining unit configured to, in a case that a traveling vehicle that has just passed through the diverging section enters the track and a traveling vehicle that has immediately thereafter passed through the diverging section is about to consecutively enter the track, when the abnormality detecting unit has detected no abnormality, skip determination of whether the traveling vehicle is allowed to enter the track and, when the abnormality detecting unit has detected an abnormality, determine whether the traveling vehicle is allowed to enter the track.

6 Claims, 6 Drawing Sheets

TRAVELING VEHICLE SYSTEM

BACKGROUND OF THE INVENTION

1. Field of the Invention

The present invention relates to a traveling vehicle system for conveying various workpieces.

2. Description of the Related Art

Conventionally, traveling vehicle systems have been known for conveying workpieces such as semiconductor wafers and glass substrates in a clean room of a factory for manufacturing semiconductor devices or liquid crystal displays, for example. In such traveling vehicle systems, to improve traveling efficiency of traveling vehicles, various traveling controls are performed at diverging sections and merging sections of a track network (see Japanese Patent Application Laid-Open Publication No. 2006-313461 and WO 2010/035411, for example).

However, in such traveling vehicle systems as described above, when some kind of abnormality occurs downstream of a diverging section, traffic congestion may develop from the position where the abnormality has occurred.

SUMMARY OF THE INVENTION

In view of this, preferred embodiments of the present invention provide a traveling vehicle system that prevents areas of traffic congestion of traveling vehicles from widening even if some kind of abnormality has occurred downstream of a diverging section, while improving traveling efficiency of the traveling vehicles.

A traveling vehicle system according to a preferred embodiment of the present invention includes a track network including a first track, and a second track and a third track that diverge from the first track at a diverging section; a plurality of traveling vehicles that travel in the track network; and a controller programmed and configured to control travel of the traveling vehicles. The controller is programmed and configured to define an abnormality detecting unit configured to detect an abnormality in a track on the downstream side of the diverging section, including at least the second track; and an entry determining unit configured to, in a case that one of the traveling vehicles that has just passed through the diverging section enters the second track and another one of the traveling vehicles that has immediately thereafter passed through the diverging section is about to consecutively enter the second track, when the abnormality detecting unit has detected no abnormality, skip determination of whether the other one of the traveling vehicles that has immediately thereafter passed through the diverging section is allowed to enter the second track and, when the abnormality detecting unit has detected the abnormality, determine whether the other one of the traveling vehicles is allowed to enter the second track.

In this traveling vehicle system, in the case that one of the traveling vehicles that has just passed through the diverging section enters the second track and another one of the traveling vehicles that has immediately thereafter passed through the diverging section is about to consecutively enter the second track, when the abnormality detecting unit has detected no abnormality in the track on the downstream side of the diverging section including the second track, determination is skipped of whether the other one of the traveling vehicles that is about to consecutively enter the second track is allowed to enter the second track. This improves the traveling efficiency of the traveling vehicles. In the case described above, when the abnormality detecting unit has detected the abnormality in the track on the downstream side of the diverging section including the second track, determination is made as to whether the other one of the traveling vehicles that is about to consecutively enter the second track is allowed to enter the second track. This prevents areas of traffic congestion of traveling vehicles from widening from the position where abnormality has occurred due to consecutive entry of traveling vehicles into the second track included in the track on the downstream side in which the abnormality has occurred. Thus, with this traveling vehicle system, it is possible to prevent areas of traffic congestion of traveling vehicles from widening even if any kind of abnormality has occurred downstream of the diverging section, while improving the traveling efficiency of the traveling vehicles.

The abnormality detecting unit preferably detects the abnormality when one of the traveling vehicles that has been determined to be allowed to enter a predetermined section in the track on the downstream side does not pass through the predetermined section for a predetermined period. The predetermined section may be a merging section on the downstream side, at which the second track merges with another track. These configurations do not require an additional sensor, for example, to detect an abnormality in the track on the downstream side, making it possible to detect an abnormality in the track on the downstream side with such simple configurations.

The abnormality detecting unit preferably stores therein in advance a combination of the diverging section and the predetermined section, where the diverging section is a subject for which determination is made as to whether the other one of the vehicles that has immediately thereafter passed through the diverging section is allowed to enter the second track, and the predetermined section is a subject for which the abnormality is detected. This configuration requires only processing to detect an abnormality in the track on the downstream side using the predetermined section associated with the diverging section as the subject, making it possible to detect an abnormality in the track on the downstream side while preventing an increase in the processing load.

The abnormality detecting unit preferably detects the abnormality when one of the traveling vehicles that has entered the second track makes an inter-vehicle stop for a predetermined period in the track on the downstream side. This configuration does not require an additional sensor, for example, to detect an abnormality in the track on the downstream side, making it possible to detect an abnormality in the track on the downstream side with such a simple configuration. The inter-vehicle stop herein means that a traveling vehicle stops to keep a predetermined inter-vehicle distance from the preceding traveling vehicle that has stopped for some reason.

Each of the traveling vehicles preferably makes a setting request for entry permission to pass through the diverging section and enter the second track or the third track and, when entry permission is set by the controller, may pass through the diverging section and enter the second track or the third track. Having made the setting request for entry permission to pass through the diverging section and enter the second track, when not determined to be allowed to enter the second track by the entry determining unit for a predetermined period, the traveling vehicle may make the setting request for entry permission to pass through the diverging section and enter the third track. With this configuration, the traveling vehicles that have made the setting request for entry permission to pass through the diverging section and enter the second track are prevented from continuously stopping just before the diverging section when abnormality has occurred in the track on the downstream side of the diverging section including the second track, such that areas of traffic congestion of traveling vehicles are prevented from widening from the diverging section.

According to various preferred embodiments of the present invention, it is possible to provide a traveling vehicle system that prevents areas of traffic congestion of traveling vehicles from widening even if any kind of abnormality has occurred downstream of a diverging section, while improving the traveling efficiency of the traveling vehicles.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
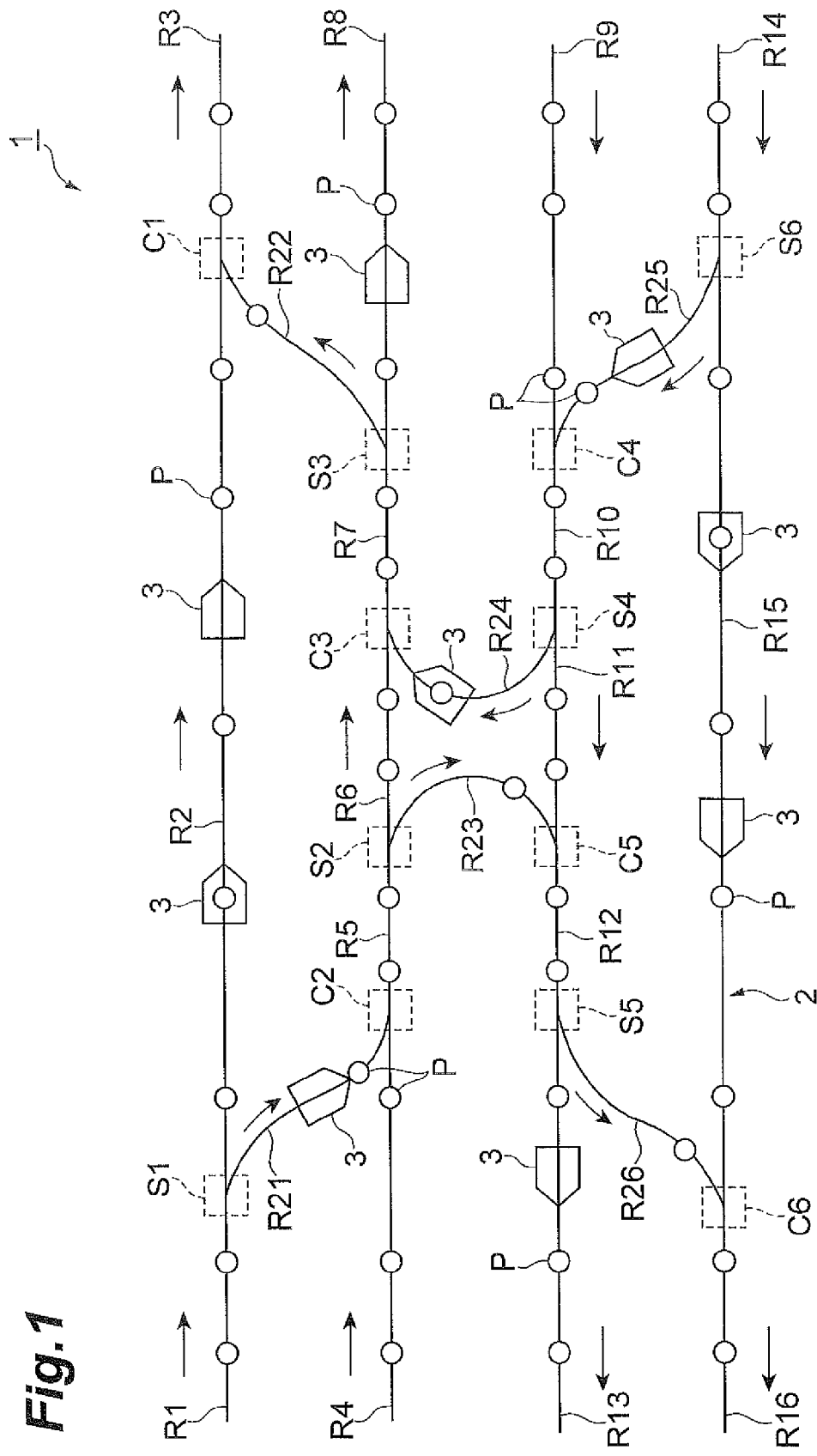
FIG. 1 is a plan view of a track network for a traveling vehicle system according to a preferred embodiment of the present invention.

Preferred embodiments of the present invention will be described hereinafter in detail with respect to the drawings. In the drawings, like reference signs indicate like or corresponding components, and duplicate description is omitted.

FIG. 1 is a plan view of a track network for a traveling vehicle system according to a preferred embodiment of the present invention. As depicted in FIG. 1, the traveling vehicle system 1 includes a track network 2 including straight tracks R1 to R16 and curved tracks R21 to R26 and a plurality of traveling vehicles 3 that travel in the arrow directions along the track network 2. To each of the tracks R1 to R16 and R21 to R26, one or more points P are provided. The traveling vehicles 3 detect their own positions in the track network 2 by reading positional information from the points P.

Such a traveling vehicle system 1 is preferably used to convey workpieces such as semiconductor wafers and glass substrates from a conveyance source to a conveyance destination in a clean room of a factory for manufacturing semiconductor devices or liquid crystal displays, for example. The traveling vehicles 3 are overhead-traveling automated guided vehicles, and create traveling routes from conveyance sources to conveyance destinations by themselves and convey the workpieces from the conveyance sources to the conveyance destinations while detecting their own positions in the track network 2. Examples of the conveyance sources and the conveyance destinations include stations configured to perform various processes on the workpieces. The traveling vehicles 3 may be other types of automated guided vehicles such as automated guided vehicles traveling on rails, for example.

In the track network 2, the track R2 and the track R21 diverge from the track R1 at a diverging section S1. The track R6 and the track R23 diverge from the track R5 at a diverging section S2. The track R8 and the track R22 diverge from the track R7 at a diverging section S3. The track R11 and the track R24 diverge from the track R10 at a diverging section S4. The track R13 and the track R26 diverge from the track R12 at a diverging section S5. The track R15 and the track R25 diverge from the track R14 at a diverging section S6.

In the track network 2, the track R2 and the track R22 merge into the track R3 at a merging section C1. The track R4 and the track R21 merge into the track R5 at a merging section C2. The track R6 and the track R24 merge into the track R7 at a merging section C3. The track R9 and the track R25 merge into the track R10 at a merging section C4. The track R11 and the track R23 merge into the track R12 at a merging section C5. The track R15 and the track R26 merge into the track R16 at a merging section C6.

Figure 2:
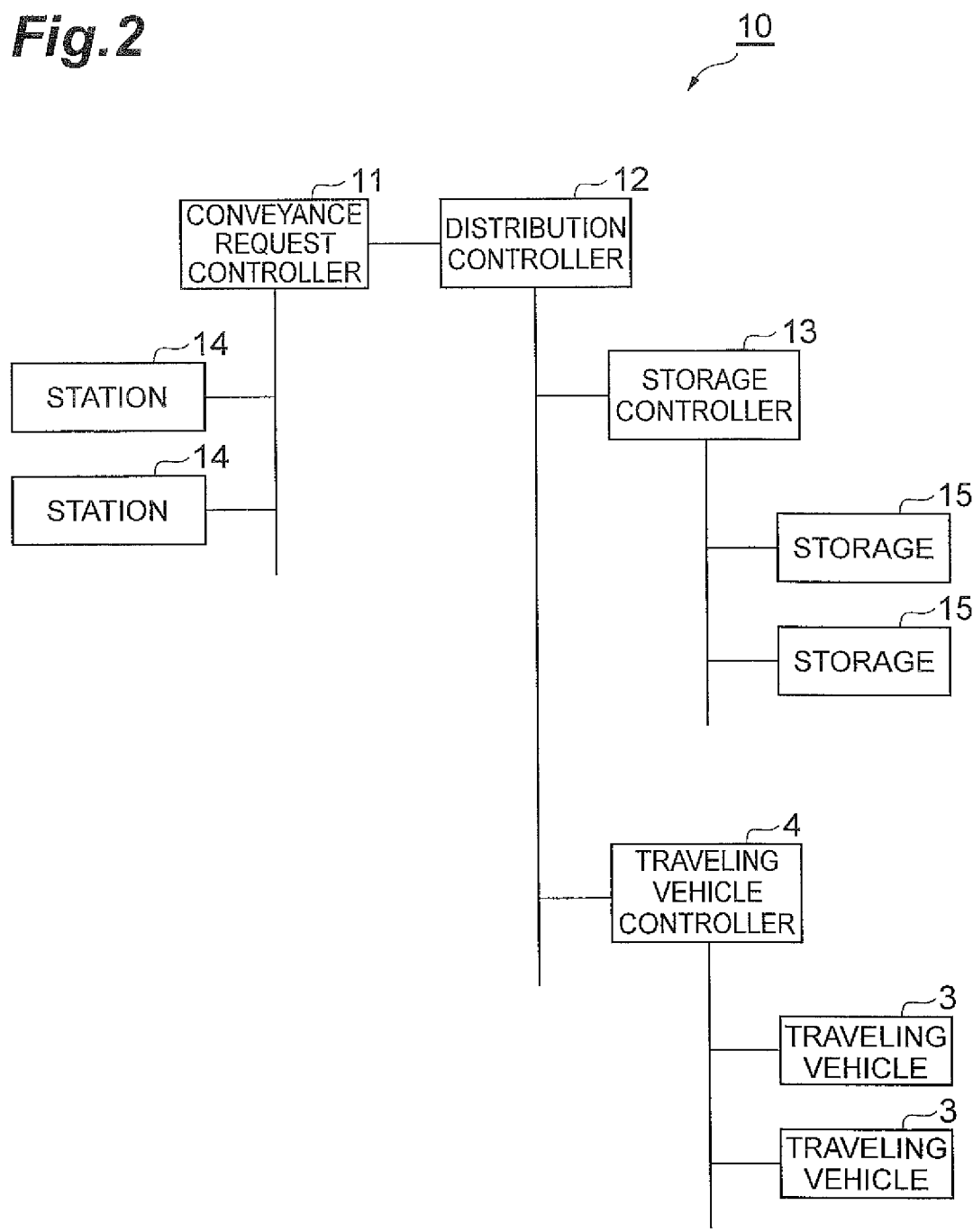
FIG. 2 is a block diagram illustrating a configuration of a control system of the traveling vehicle system according to a preferred embodiment of the present invention.

FIG. 2 is a block diagram illustrating a configuration of a control system of the traveling vehicle system according to a preferred embodiment of the present invention. As depicted in FIG. 2, this control system 10 of the traveling vehicle system 1 includes, in addition to a traveling vehicle controller 4 for controlling travel of the traveling vehicles 3, a conveyance request controller 11, a distribution controller 12, and a storage controller 13. The distribution controller 12 is a higher-order controller of the traveling vehicle controller 4 and the storage controller 13, and is programmed and configured to communicate with each of the controllers 4 and 13. The conveyance request controller 11 is programmed and configured to communicate with each of a plurality of stations 14 to perform various processes on workpieces. The storage controller 13 is programmed and configured to communicate with each of a plurality of storages 15 to temporarily store therein the workpieces. The traveling vehicle controller 4 is programmed and configured to communicate with each of the traveling vehicles 3.

Having received a conveyance request (carry-in request and carry-out request) of workpieces from a station 14, the conveyance request controller 11 transmits the conveyance request to the distribution controller 12. The distribution controller 12 that has received the conveyance request transmits a storage-and-retrieval request of the workpieces to the storage controller 13, if necessary. The storage controller 13 that has received the storage-and-retrieval request transmits a storage-and-retrieval command to a storage 15. The storage 15 that has received the storage-and-retrieval command performs storage and retrieval of the workpieces on a traveling vehicle 3 at a predetermined timing.

The distribution controller 12 that has received the conveyance request from the conveyance request controller 11 transmits the conveyance request to the traveling vehicle controller 4. The traveling vehicle controller 4 that has received the conveyance request transmits a conveyance command to the traveling vehicle 3. The traveling vehicle 3 that has received the conveyance command creates a traveling route from a station 14 being a conveyance source to another station 14 being a conveyance destination by itself, and conveys the workpieces from the station 14 being the conveyance source to the station 14 being the conveyance destination while detecting its own position in the track network 2. At this time, the traveling vehicle 3 reads positional information from the points P provided to the track network 2, thus detecting its own position in the track network 2 to transmit the positional information of its own to the traveling vehicle controller 4 as needed.

Figure 3:
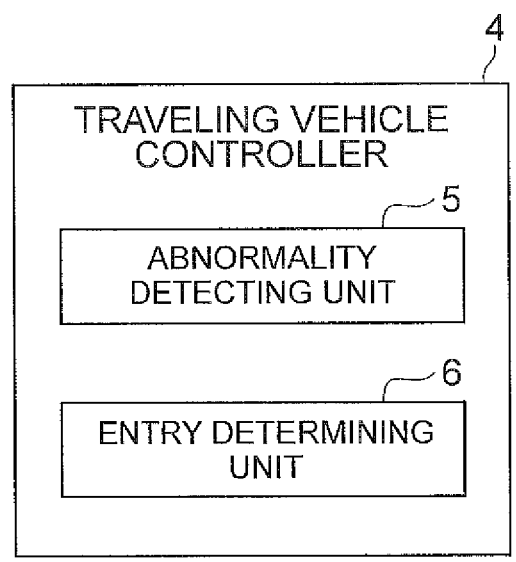
FIG. 3 is a block diagram illustrating a configuration of the traveling vehicle controller depicted in FIG. 2.

FIG. 3 is a block diagram illustrating a configuration of the traveling vehicle controller depicted in FIG. 2. As depicted in FIG. 3, the traveling vehicle controller 4 is an electronic control unit including a CPU, a ROM, and a RAM, for example, and includes at least an abnormality detecting unit 5 and an entry determining unit 6. The traveling vehicle controller 4 loads a program stored in the ROM on the RAM and causes the CPU to execute the program, thus constituting the abnormality detecting unit 5 and the entry determining unit 6 as software. Alternatively, the respective processing units of the traveling vehicle controller 4 may be constituted by hardware.

The abnormality detecting unit 5 detects an abnormality in the tracks R2, R6, R8, R11, R13, R15, and R21 to R26 that diverge from the respective diverging sections S1 to S6. When traveling vehicles 3 are about to pass through the respective diverging sections S1 to S6, the entry determining unit 6 determines whether the traveling vehicles 3 that are about to pass through the respective diverging sections S1 to S6 are allowed to enter the tracks R2, R6, R8, R11, R13, R15, and R21 to R26 on the basis of situations of abnormality detected by the abnormality detecting unit 5. The abnormality detecting unit 5 and the entry determining unit 6 will be described in further detail below.

Figure 4:
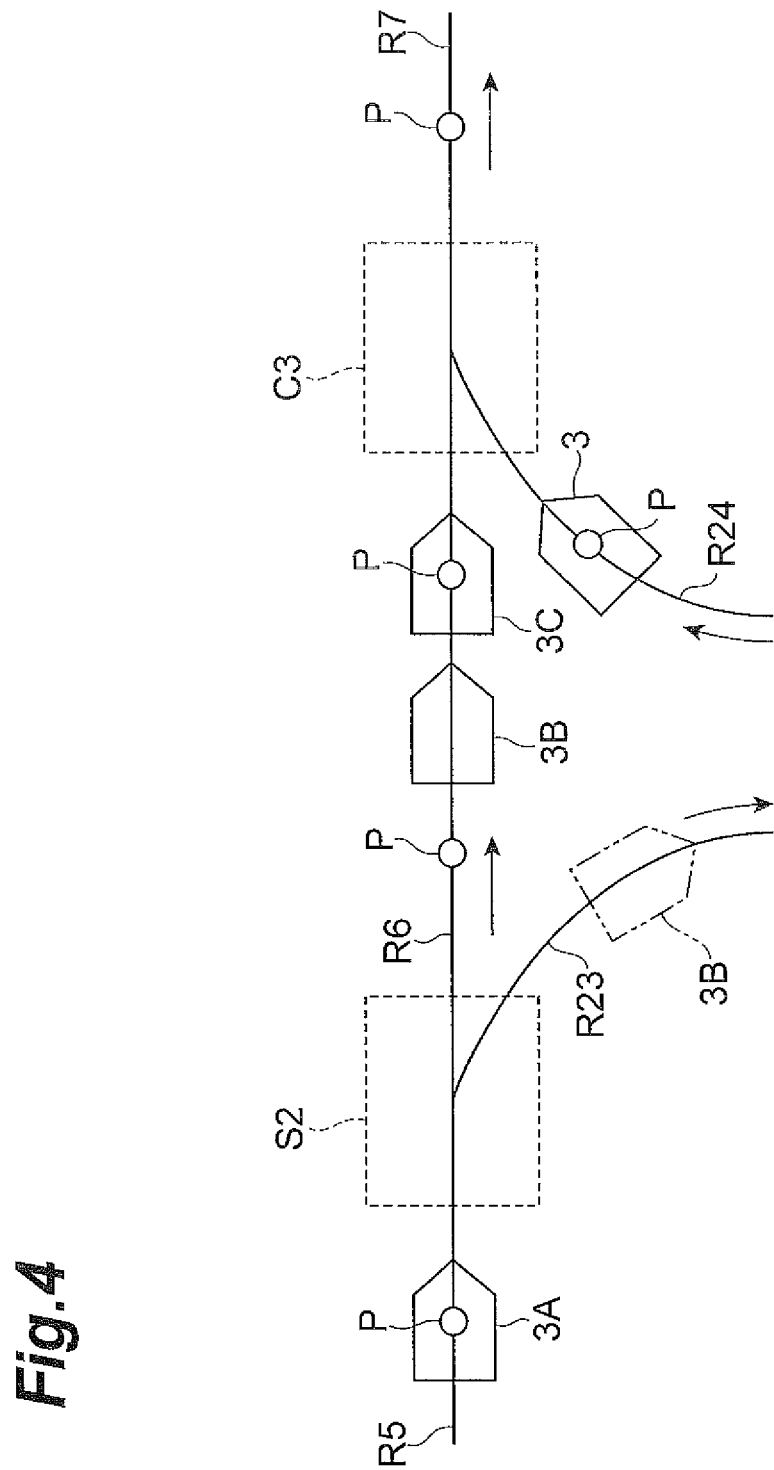
FIG. 4 is a partially enlarged diagram of the track network depicted in FIG. 1.
Figure 5:
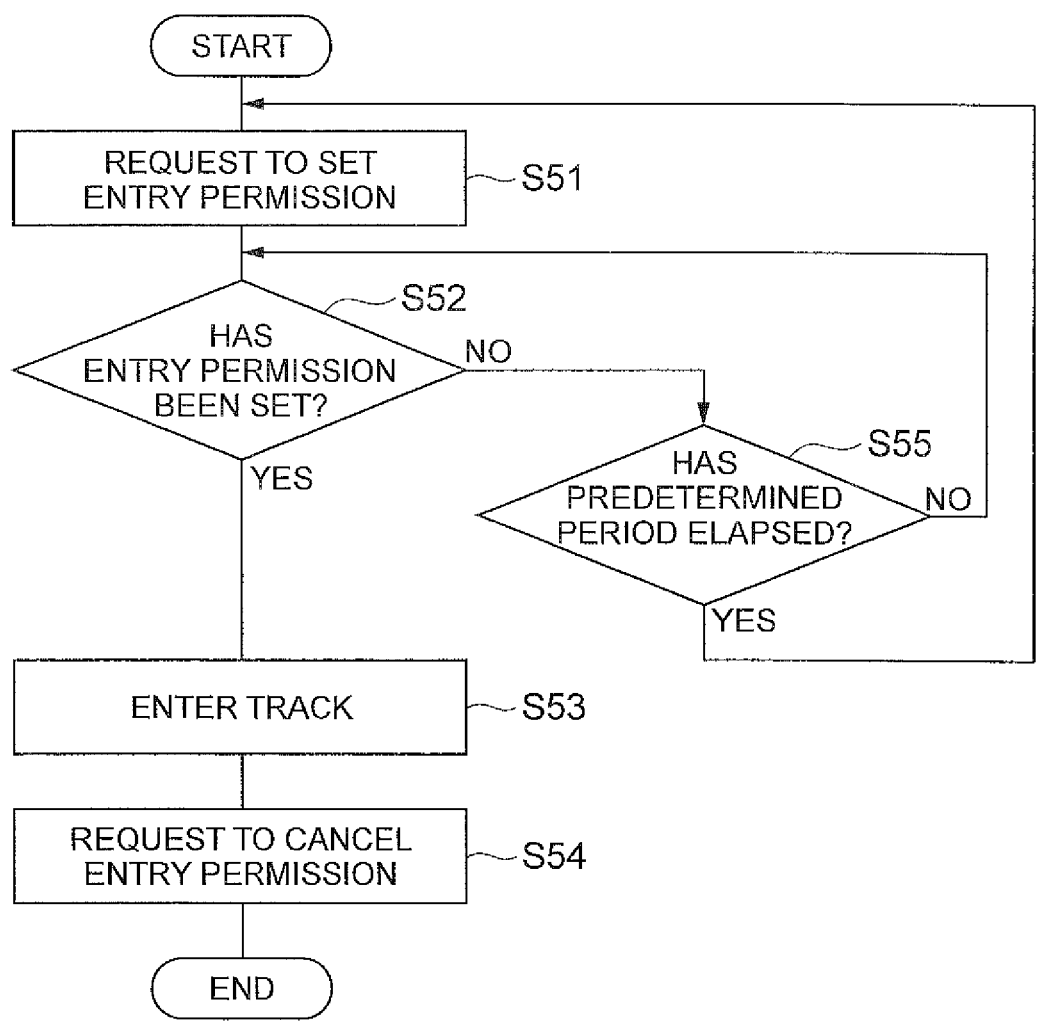
FIG. 5 is a flowchart illustrating a processing procedure in a traveling vehicle depicted in FIG. 2.

In an area around the diverging section S2 and the merging section C3 depicted in FIG. 4 as an example, a processing procedure in a traveling vehicle 3A will be described with reference to the flowchart in FIG. 5. The traveling vehicle 3A that has created a traveling route using one of the tracks R6 and R23, when approaching the diverging section S2 in the track R5, transmits a setting request for entry permission to the traveling vehicle controller 4 (step S51). This setting request for entry permission is designed to request the traveling vehicle controller 4 to set entry permission to pass through the diverging section S2 and enter one of the tracks R6 and R23.

If the entry permission has been set by the traveling vehicle controller 4 (step S52), the traveling vehicle 3A passes through the diverging section S2 and enters the track R6 or the track R23 for which the entry permission has been set (step S53). Subsequently, the traveling vehicle 3A that has passed through the diverging section S2 transmits a request to cancel the entry permission to the traveling vehicle controller 4 (step S54).

If the entry permission has not been set by the traveling vehicle controller 4 (step S52), the traveling vehicle 3A stops just before the section S2. When a predetermined period (e.g., a predetermined period of time since the setting request for entry permission was transmitted) has not elapsed (step S55), the traveling vehicle 3A performs a process of step S52. When the predetermined period has elapsed (step S55), the traveling vehicle 3A re-creates a traveling route using the other one of the tracks R6 and R23 and transmits another setting request for entry permission to the traveling vehicle controller 4 (step S51), and performs processes of step S52 and the following steps. This other setting request for entry permission is designed to request the traveling controller 4 to set entry permission to pass through the diverging section S2 and enter the other one of the tracks R6 and R23.

As described above, when the entry permission to pass through the diverging section S2 and enter one of the tracks R6 and R23 has not been set by the traveling vehicle controller 4, the traveling vehicle 3A requests the traveling vehicle controller 4 to set entry permission to pass through the diverging section S2 and enter the other one of the tracks R6 and R23.

Figure 6:
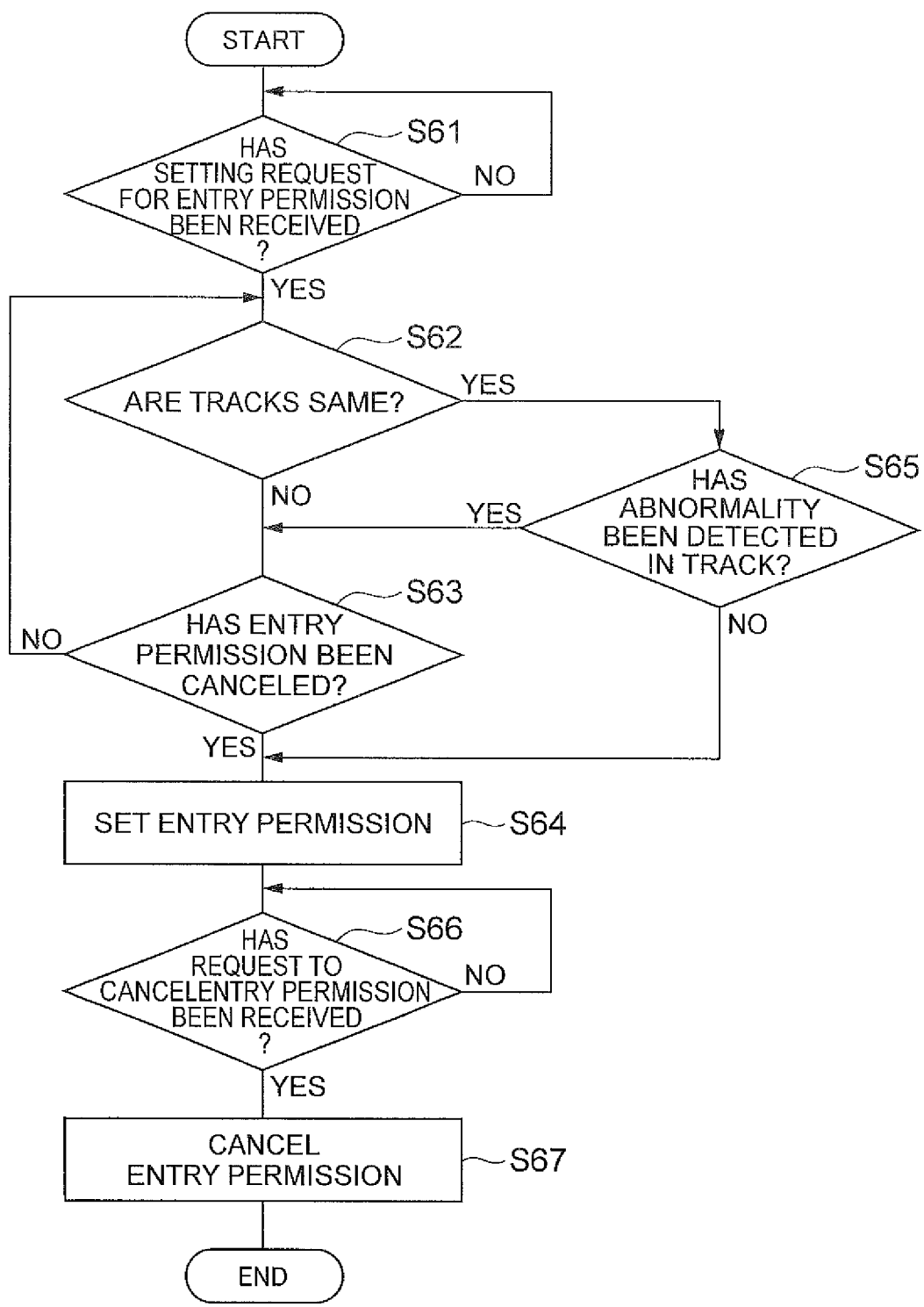
FIG. 6 is a flowchart illustrating a processing procedure in the traveling vehicle controller depicted in FIG. 2.

In the area around the diverging section S2 and the merging section C3 depicted in FIG. 4 as an example, a processing procedure in the traveling vehicle controller 4 will be described with reference to the flowchart in FIG. 6. It is assumed herein that the abnormality detecting unit 5 of the traveling vehicle controller 4 monitors the presence or absence of abnormality in the respective tracks R6 and R23. Under this assumption, when the traveling vehicle controller 4 has received a setting request for entry permission from the traveling vehicle 3A approaching the diverging section S2 in the track R5 (step S61), the entry determining unit 6 of the traveling vehicle controller 4 determines whether one of the tracks R6 and R23 that the traveling vehicle 3A (another one of the traveling vehicles 3 that has immediately thereafter passed through the diverging section S2) is about to enter is the same as the track R6 or the track R23 that a traveling vehicle 3B (one of the traveling vehicles 3 that has just passed through the diverging section S2) has entered (step S62). This determination process is performed based on the setting request for entry permission that has finally been received from the traveling vehicle 3B and the setting request for entry permission that has been received from the traveling vehicle 3A.

As a result of the determination process at step S62, if the one of the tracks R6 and R23 that the traveling vehicle 3A is about to enter differs from the track R6 or the track R23 that the traveling vehicle 3B has entered (e.g., after the traveling vehicle 3B has entered the track R23 (see the two-dot chain line in FIG. 4), the traveling vehicle 3A is about to enter the track R6), the entry determining unit 6 determines whether the entry permission to the one of the tracks R6 and R23 has been canceled (step S63). In accordance with the determination, if the entry permission has not been canceled, the process returns to step S62, and if the entry permission has been canceled, the entry determining unit 6 sets the entry permission to the one of the tracks R6 and R23 (step S64).

In this manner, in the case that the one of the tracks R6 and R23 that the traveling vehicle 3A is about to enter differs from the track R6 or the track R23 that the traveling vehicle 3B has entered, the entry determining unit 6 performs a determination (herein, the determination process at step S63) of whether the traveling vehicle 3A is allowed to enter the one of the tracks R6 and R23 regardless of situations of abnormality detected by the abnormality detecting unit 5.

As a result of the determination process at step S62, if the one of the tracks R6 and R23 that the traveling vehicle 3A is about to enter is the same as the track R6 or the track R23 that the traveling vehicle 3B has entered (e.g., after the traveling vehicle 3B has entered the track R6 (see the solid line in FIG. 4), the traveling vehicle 3A is about to enter the track R6), the entry determining unit 6 determines whether abnormality in the one of the tracks R6 and R23 has been detected by the abnormality detecting unit 5 (step S65). In accordance with the determination, if abnormality has not been detected, the entry determining unit 6 sets the entry permission to the one of the tracks R6 and R23 (step S64) without determining whether the entry permission has been canceled.

In this manner, in the case that the one of the tracks R6 and R23 that the traveling vehicle 3A is about to enter is the same as the track R6 or the track R23 that the traveling vehicle 3B has entered, when abnormality has not been detected by the abnormality detecting unit 5, the entry determining unit 6 skips determination (herein, the determination process at step S63) of whether the traveling vehicle 3A is allowed to enter the one of the tracks R6 and R23.

When abnormality has been detected as a result of the determination process at step S65, the entry determining unit 6 determines whether the entry permission to the one of the tracks R6 and R23 has been canceled (step S63). In accordance with the determination, if the entry permission has not been canceled, the process returns to step S62, and if the entry permission has been canceled, the entry determining unit 6 sets the entry permission to the one of the tracks R6 and R23 (step S64).

In this manner, in the case that the one of the tracks R6 and R23 that the traveling vehicle 3A is about to enter is the same as the track R6 or the track R23 that the traveling vehicle 3B has entered, when abnormality has been detected by the abnormality detecting unit 5, the entry determining unit 6 performs a determination (herein, the determination process at step S63) of whether the traveling vehicle 3A is allowed to enter the one of the tracks R6 and R23.

The traveling vehicle controller 4 that has set the entry permission to the one of the tracks R6 and R23, when a request to cancel the entry permission is received from the traveling vehicle 3A that has passed through the diverging section S2 (step S66), cancels the entry permission (step S67).

A process for detecting abnormality in the abnormality detecting unit 5 will be described hereinafter. It is assumed that the abnormality detecting unit 5 stores therein in advance combinations of the diverging sections S1 to S6 and the merging sections C1 to C6, where the diverging sections S1 to S6 are subjects for which determination of whether entry thereto is allowed is made, and the merging sections C1 to C6 are subjects for which abnormality is detected. As depicted in FIG. 1, the diverging section S1 is associated with the merging sections C1 and C2 that are the nearest merging sections on the respective downstream sides thereof, and the abnormality detecting unit 5 stores a combination of the diverging section S1 and the merging sections C1 and C2 thus associated. Similarly, the abnormality detecting unit 5 stores therein a combination of the diverging section S2 and the merging sections C3 and C5, a combination of the diverging section S3 and the merging section C1, a combination of the diverging section S4 and the merging sections C3 and C5, a combination of the diverging section S5 and the merging section C6, and a combination of the diverging section S6 and the merging sections C4 and C6.

Under this assumption, the abnormality detecting unit 5 performs the process for detecting abnormality as follows. For example, as depicted in FIG. 4, in a situation that entry permission for a traveling vehicle 3C traveling in the track R6 to enter the merging section C3 has been set, if the traveling vehicle 3C has stopped due to an occurrence of an abnormality on the traveling vehicle 3C, the abnormality detecting unit 5 detects that the abnormality has occurred in the track R6 when the traveling vehicle 3C does not pass through the merging section C3 for the predetermined period.

Furthermore, in the above-described situation, if the traveling vehicle 3C has stopped due to an occurrence of an abnormality on the traveling vehicle 3C, the abnormality detecting unit 5 detects that the abnormality has occurred in the track R6 when the traveling vehicle 3B that entered the track R6 and has stopped in the track R6 for the predetermined period. In other words, when the traveling vehicle 3B that had entered the track R6 stopped to keep an inter-vehicle distance from the traveling vehicle 3C and the predetermined period has elapsed in this state, the abnormality detecting unit 5 detects that the abnormality has occurred in the track R6 by communicating with the traveling vehicle 3B.

Information on detecting the abnormality in the track R6 described above is used when determination is made of whether the traveling vehicle 3A that is about to pass through the diverging section S2 stored in association with the merging section C3 is allowed to enter the one of the tracks R6 and R23 (the determination process at step S65 performed by the entry determining unit 6 described above).

With the traveling vehicle system 1 configured as above, it is possible to prevent areas of traffic congestion of the traveling vehicles 3 from widening even if any kind of abnormality has occurred downstream of the diverging sections S1 to S6, while improving the traveling efficiency of the traveling vehicles 3.

More specifically, in the traveling vehicle system 1, in the case that the traveling vehicle 3B that has just entered the diverging section S2 enters the track R6 and the traveling vehicle 3A that has immediately thereafter passed through the diverging section S2 is about to consecutively enter the track R6, when abnormality in the track R6 has not been detected, determination is skipped of whether the traveling vehicle 3A that is about to consecutively enter the track R6 is allowed to enter the track R6. Similarly, in the case that the traveling vehicle 3B that has just entered the diverging section S2 enters the track R23 and the traveling vehicle 3A that has immediately thereafter passed through the diverging section S2 is about to consecutively enter the track R23, when abnormality in the track R23 has not been detected, determination is skipped of whether the traveling vehicle 3A that is about to consecutively enter the track R23 is allowed to enter the track R23. These operations apply to such cases of the diverging sections S1, and S3 to S6. This improves the traveling efficiency of the traveling vehicles 3.

In the traveling vehicle system 1, in the case that the traveling vehicle 3B that has just passed through the diverging section S2 enters the track R6 and the traveling vehicle 3A that has immediately thereafter passed through the diverging section S2 is about to consecutively enter the track R6, when abnormality in the track R6 has been detected, determination is made of whether the traveling vehicle 3A that is about to consecutively enter the track R6 is allowed to enter the track R6. Similarly, in the case that the traveling vehicle 3B that has just passed through the diverging section S2 enters the track R23 and the traveling vehicle 3A that has immediately thereafter passed through the diverging section S2 is about to consecutively enter the track R23, when an abnormality in the track R23 has been detected, determination is made of whether the traveling vehicle 3A that is about to consecutively enter the track R23 is allowed to enter the track R23. These operations apply to such cases of the diverging sections S1, and S3 to S6. This prevents areas of traffic congestion of the traveling vehicles 3 from widening from the position where abnormality has occurred due to consecutive entry of the traveling vehicles 3 into the tracks R2, R6, R8, R11, R13, R15, and R21 to R26 (hereinafter, referred to as "tracks R2, etc.") on the downstream side of the diverging sections S1 to S6 in which the abnormality has occurred.

The abnormality detecting unit 5 of the traveling vehicle controller 4 detects an abnormality in the track R6 when the traveling vehicle 3C that has been determined to be allowed to enter the merging section C3 on the downstream side of the diverging section S2 does not pass through the merging section C3 for the predetermined period. Similarly, the abnormality detecting unit 5 detects the abnormality in the track R23 when the traveling vehicle 3 that has been determined to be allowed to enter the merging section C5 on the downstream side of the diverging section S2 does not pass through the merging section C5 for the predetermined period. These operations apply to such cases of the diverging sections S1, and S3 to S6. This eliminates the necessity of newly providing a sensor, for example, to detect an abnormality in the tracks R2, etc., on the downstream side of the diverging sections S1 to S6, thus making it possible to detect an abnormality in the tracks R2, etc., with such simple configurations.

The abnormality detecting unit 5 stores therein in advance the combinations of the diverging sections S1 to S6 and the merging sections C1 to C6, where the diverging sections S1 to S6 are subjects for which determination of whether entry thereto is allowed is made, and the merging sections C1 to C6 are subjects for which abnormality is detected. This requires only processing to detect abnormality in the tracks R2, etc., using as the subjects the merging sections C1 to C6 that are associated with the diverging sections S1 to S6, making it possible to detect an abnormality in the tracks R2, etc., while preventing an increase in the processing load.

The abnormality detecting unit 5 detects an abnormality when the traveling vehicle 3B that has entered the tracks R2, etc., on the downstream side of the diverging sections S1 to S6 makes an inter-vehicle stop for the predetermined period. This eliminates the necessity of newly providing a sensor, for example, to detect an abnormality in the tracks R2, etc., on the downstream side of the diverging sections S1 to S6, thus making it possible to detect an abnormality in the tracks R2, etc., with such simple configurations.

In the case that the traveling vehicle 3A has made a setting request for entry permission to pass through the diverging section S2 and enter one of the tracks R6 and R23, when the traveling vehicle 3A is not determined to be allowed to enter the one of the tracks R6 and R23 by the entry determining unit 6 of the traveling vehicle controller 4 for a predetermined period, the traveling vehicle 3A makes a setting request for entry permission to pass through the diverging section S2 and enter the other one of the tracks R6 and R23. Accordingly, the traveling vehicle 3A that has made the setting request for entry permission to pass through the diverging section S2 and enter the one of the tracks R6 and R23 is prevented from continuously stopping just before the diverging section S2 when an abnormality has occurred in the one of the tracks R6 and R23. These operations apply to such cases of the diverging sections S1, and S3 to S6. Thus, areas of traffic congestion of the traveling vehicles 3 areas prevented from widening from the diverging sections S1 to S6.

One preferred embodiment of the present invention has been described above, but the present invention is not limited to the above-described preferred embodiment. For example, the abnormality detecting unit 5 of the traveling vehicle controller 4 is not limited to a unit programmed and configured to detect an abnormality in the tracks R2, etc. (e.g., the track R2 or the track R21 for the diverging section S1), and may be a unit programmed and configured to detect abnormality in tracks (e.g., the tracks R2 and R3 or the tracks R21 and R5 for the diverging section S1) on the downstream side of the diverging sections S1 to S6 including at least the tracks S2, etc., When traveling vehicles 3 that have been determined to be allowed to enter predetermined sections (in addition to the merging sections C1 to C6, diverging sections at which the tracks R2, etc., diverge into a plurality of other tracks, or portions at which the points P are provided, for example) in tracks on the downstream side of the diverging sections S1 to S6 including at least the tracks R2, etc., do not pass through the predetermined sections for a predetermined period, the abnormality detecting unit 5 may detect an abnormality in the tracks on the downstream side.

According to various preferred embodiments of the present invention, it is possible to provide a traveling vehicle system that prevents areas of traffic congestion of traveling vehicles from widening even if any kind of abnormality has occurred downstream of a diverging section, while improving the traveling efficiency of the traveling vehicles.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A traveling vehicle system comprising:
   a track network including a first track, and a second track and a third track that diverge from the first track at a diverging section;
   a plurality of traveling vehicles that travel in the track network; and
   a controller programmed and configured to control travel of the traveling vehicles and to include:
      an abnormality detecting unit configured to detect an abnormality in a track on the downstream side of the diverging section, including at least the second track; and
      an entry determining unit configured to, in a case that one of the traveling vehicles that has just passed through the diverging section enters the second track and another one of the traveling vehicles that has immediately thereafter passed through the diverging section is about to consecutively enter the second track, when the abnormality detecting unit has detected no abnormality, skip determination of whether the other one of the traveling vehicles that has immediately thereafter passed through the diverging section is allowed to enter the second track and, when the abnormality detecting unit has detected the abnormality, determine whether the other one of the traveling vehicles is allowed to enter the second track.

2. The traveling vehicle system according to claim 1, wherein the abnormality detecting unit is configured to detect the abnormality when one of the traveling vehicles that has been determined to be allowed to enter a predetermined section in the track on the downstream side does not pass through the predetermined section for a predetermined period.

3. The traveling vehicle system according to claim 2, wherein the predetermined section includes a merging section on the downstream side, at which the second track merges with another track.

4. The traveling vehicle system according to claim 2, wherein:
   the abnormality detecting unit stores, in advance, information regarding a combination of the diverging section and the predetermined section, and
   according to a determination made by the abnormality detecting unit that the abnormality has occurred in the predetermined section, the entry determining unit determines whether the other one of the vehicles that has immediately thereafter passed through the diverging section is allowed to enter the second track.

5. The traveling vehicle system according to claim 1, wherein the abnormality detecting unit is configured to detect the abnormality when one of the traveling vehicles that has entered the second track makes an inter-vehicle stop for a predetermined period in the track on the downstream side.

6. The traveling vehicle system according to claim 1, wherein
   each of the traveling vehicles is configured to make a setting request for entry permission to pass through the diverging section and enter the second track or the third track and, when entry permission is set by the controller, passes through the diverging section and enters the second track or the third track; and
   having made the setting request for entry permission to pass through the diverging section and enter the second track, when not determined to be allowed to enter the second track by the entry determining unit for a predetermined period, the traveling vehicle is configured to make the setting request for entry permission to pass through the diverging section and enter the third track.

* * * * *